United States Patent [19]

Freller et al.

[11] Patent Number: 4,842,710

[45] Date of Patent: Jun. 27, 1989

[54] METHOD OF MAKING MIXED NITRIDE FILMS WITH AT LEAST TWO METALS

[75] Inventors: Helmut Freller, Roethenbach; Peter Schack, Nurenberg, both of Fed. Rep. of Germany

[73] Assignee: Siemens Aktiengesellschaft, Berlin and Munich, Fed. Rep. of Germany

[21] Appl. No.: 165,872

[22] Filed: Mar. 9, 1988

[30] Foreign Application Priority Data

Mar. 23, 1987 [DE] Fed. Rep. of Germany ....... 3709468

[51] Int. Cl.$^4$ ............................................. C23C 14/22
[52] U.S. Cl. ......................... 204/192.38; 204/192.16; 427/37
[58] Field of Search ............. 204/192.1, 192.12, 192.3, 204/192.16, 192.32, 298, 192.38, 298 D; 427/37, 38

[56] References Cited

U.S. PATENT DOCUMENTS

| | | | |
|---|---|---|---|
| 4,060,471 | 11/1977 | Pinch et al. | 204/192 SP |
| 4,346,123 | 8/1982 | Kaufman | 204/192.38 X |
| 4,419,202 | 12/1983 | Gibson | 204/192.3 X |
| 4,467,437 | 8/1984 | Patten et al. | 204/192.3 X |
| 4,620,913 | 11/1986 | Bergman | 204/298 X |
| 4,716,083 | 12/1987 | Eichen et al. | 204/192.16 X |

FOREIGN PATENT DOCUMENTS

| | | |
|---|---|---|
| 538944 | 7/1980 | Australia . |
| 0038294 | 10/1981 | European Pat. Off. . |
| 2156413 | 5/1973 | France . |
| 2557562 | 7/1985 | France . |
| 2117009 | 10/1983 | United Kingdom . |

OTHER PUBLICATIONS

Locker et al., "Preparation of Hafnium-Tantalum ...", 11/71, pp. 1856 to 1862.
Knotek et al., "On Structure and Properties ...", 1986, pp. 2695 to 2700.
Jehn et al., "Morphology and Properties of Sputtered ...", 1986, pp. 2701 to 2705.
Poitevin et al., "Influence of Substrate Bias ...", 1982, pp. 69 to 77.
Smith, "Method of Varying Composition ...", 11/81, pp. 2962 to 2963.
Patent Abstracts of Japan, vol. 8, No. 98, 5/84, No 59-13608.
European Search Report.

Primary Examiner—Nam X. Nguyen
Attorney, Agent, or Firm—John Francis Moran

[57] ABSTRACT

In particular for coating tools and product components, which are subject to extremely high wear, metal nitride films are used. It has been found that if the metals have markedly different melting points, in accordance with the invention, the concentrations of the metals can be varied as a function of the film thickness. For manufacturing such mixed nitride films by vaporization of metal alloy cathodes by means of an arc while simultaneously introducing nitrogen as reaction gas, a variable voltage is applied to the substrate during vaporization of the metal alloy and varied as a function of the film thickness on the substrate.

11 Claims, 2 Drawing Sheets

METHOD OF MAKING MIXED NITRIDE FILMS WITH AT LEAST TWO METALS

BACKGROUND OF THE INVENTION

The present invention relates to mixed nitrides in films having at least two metals, in particular for coating tools and product components subject to extremely heavy wear, with the metals having a markedly different melting point. Mixed nitrides, in this case, referring to a solid solution between its different components. In addition, this invention relates to the associated method or process for manufacturing such mixed nitride films by depositing of metal alloy targets by means of an arc with the simultaneous addition of nitrogen as a reaction gas.

The application of conventional physical vapor deposition, PVD, coating methods as wear protection on tools has so far been remarkable success. The coating system, the techniques of which have been fully developed today for these applications, namely TiN, is, however, not yet suited to offer a complete solution for all wear problems. The number of hard substances with comparable hardness values is extraordinarily large. Since these hard substances have to some extent be metallic, covalent or ionic bonding character, they are, in general, very different with respect to their chemical, electrical, thermal and/or mechanical properties. In many instances, these known hard substances can also be combined or even mixed.

In particular mixed films or multilayer-films would within one single film of a few microns ($\mu$m) permit division of functions between the film surface, which must be as hard as possible and with respect to the material to be worked or the adjoining medium chemically stable at the working temperature, and the film adjoining the carrier material, which should have high chemical affinity for this material and comparable thermal coefficient of expansion and E-module in order to permit optimum adhesion even under heavy use or wear and tear.

With chemical vapor deposition, CVD, methods, the manufacture of graded films is already used on a commercial scale for coating hard metal indexable inserts. In this method the film concentration is regulated by way of concentration changes of the used gases, however, with comparatively high reaction temperatures being required for the process. At 1000° C., however, the working temperatures are far too high for many precision parts, in particular for those of tool steels, so that the resulting form changes exclude broad-range general application. The PVD methods, which can be used at low temperatures, in particular cathode sputtering methods require, by contnrast, either for each concentration a source with graded alloy proportions or a part to be coated, the geometric position of which needs to be changed with respect to several different material sources. This method is not very useful for practical applications.

SUMMARY OF THE INVENTION

It is an object of the present invention is to solve the aforementioned problems by providing mixed nitride films particularly adapted to different requirements.

The problem is solved by the invention in that in a mixed nitride film with at least two metals the concentration of the metals is variable as a function of the film thickness. In particular the concentration here can be continuously variable. Mixed nitride films of this nature can be prepared in the form $Ti_xAl_{1-x}N$ or $Ti_xAl_{1-(x+y)}V_yN$.

For preparing such mixed nitride films during vaporization of the metal alloy, a variable voltage is applied to the substrate and varied as a function of the film thickness on the substrate.

The invention builds on the vaporization known per se of a cathode of a starting alloy by means of an arc source and the condensation on the substrate, with the substrate now, however, being at any potential up to approximately four hundred volts compared to the alloy cathode. Vaporization can take place in the manner known in the reactive mode if nitrogen is introduced as a reaction gas.

The invention permits preparation of mixed nitride films with two or more metals. If such two- or three-component alloy systems are vaporized at a pressure of 1 Pa (Pascal) in a nitrogen atmosphere, for example, the effect observed initially and unexpectedly is that the metals in the film can be found in changed concentrations compared to the starting alloy. In particular, it can be observed that the ratio of the metals are a function of the voltage and specifically in such a way that the concentration of the metal with the lower melting point decreases with increasing negative substrate voltage.

The latter effect in accordance with the principles of the invention could initially not be expected, since the "flash"-like vaporization from the rapidly migrating cathode spot of the arc actually permits uniform vaporization, a fact factually verified at substrate potentials around zero volts. It was recognized within the context of the invention that the reason for the effect of the substrate bias voltage can be found in the different ionization rates of the individual materials by means of the vacuum arc. While the predominantly positive metal ions are attracted by the negatively biased substrate at an accelerating voltage, the neutral vapor particles distribute themselves according to a cosine distribution in the space around the vaporizer and are not affected by the substrate voltage. Since the ion proportion in metals with high melting point is higher than in metals with low melting point, the substrate voltage at an accelerating voltage affects directly the concentration ratio of the metals when the metals are selected to have a significant difference melting points or temperatures.

BRIEF DESCRIPTION OF THE DRAWINGS

Further details and advantages of the invention become apparent from the following specification of illustrative embodiments. In addition, reference is made to the enclosed table as well as to the graphic representations.

DETAILED DESCRIPTION OF PREFERRED EMBODIMENTS

For preparing the mixed nitride films a conventional vacuum system is used, in which cathodes of metal alloys are vaporized by means of an arc. Simultaneously, nitrogen is introduced as a reactive gas, so that the ionized metal atoms can react with the gas atoms. An accelerating voltage variable between 0 and −400 V may be applied to the substrate.

In general, films of approximately 2 to approximately 15 microns are grown. The coated substrate samples were subsequently tested specifically for surface hardness, abrasion resistance, and in particular for concentration changes of the metals as a function of the film thickness. For the latter known methods are employed, for example microprobe tests Auger analysis or GDOS (Glow Discharge Optical Spectroscopy) methods.

EXAMPLE 1: PREPARATION OF $Ti_xAl_{1-x}N$ FILMS

Figure 1:
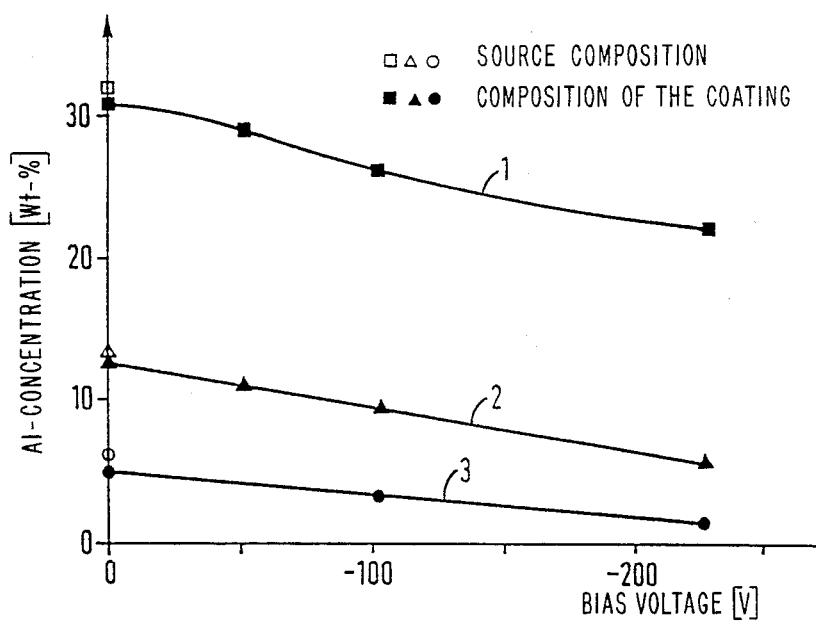
FIG. 1 demonstrates the aluminum concentration in three different titanium aluminum nitride films as a function of the substrate voltage.

In FIG. 1, the experimental results of three test series are shown: the curves represent in each instance the aluminum content in weight percent of titanium aluminum nitride films. Curve 1 was generated from a TiAl (32 weight percent Al) alloy cathode, curve 2 from a TiAl (13 weight percent Al) alloy cathode, and curve 3 from a TiAl (6 weight percent) alloy cathode. On the abscissa, values of the inverse voltage applied to the substrate are represented between zero and 250 volts. In all instances, it becomes apparent that the aluminum content decreases markedly with increasing substrate voltage with the decrease being approximately to the same degree. With respect to the starting concentration relative variations of the aluminum content between 5 and 60% occur. Fundamentally, in curve 1 the aluminum content can be decreased from a 30% Al starting concentration to approximately 25%, in curve 2 from a 12% Al starting concentration to approximately 9%, and in curve 3 from a 5% starting concentration to approximately 2%. The titanium content increases inversely.

EXAMPLE 2: PREPARATION OF $Ti_xAl_{1-(x+y)}V_yN$ FILMS

Figure 2:
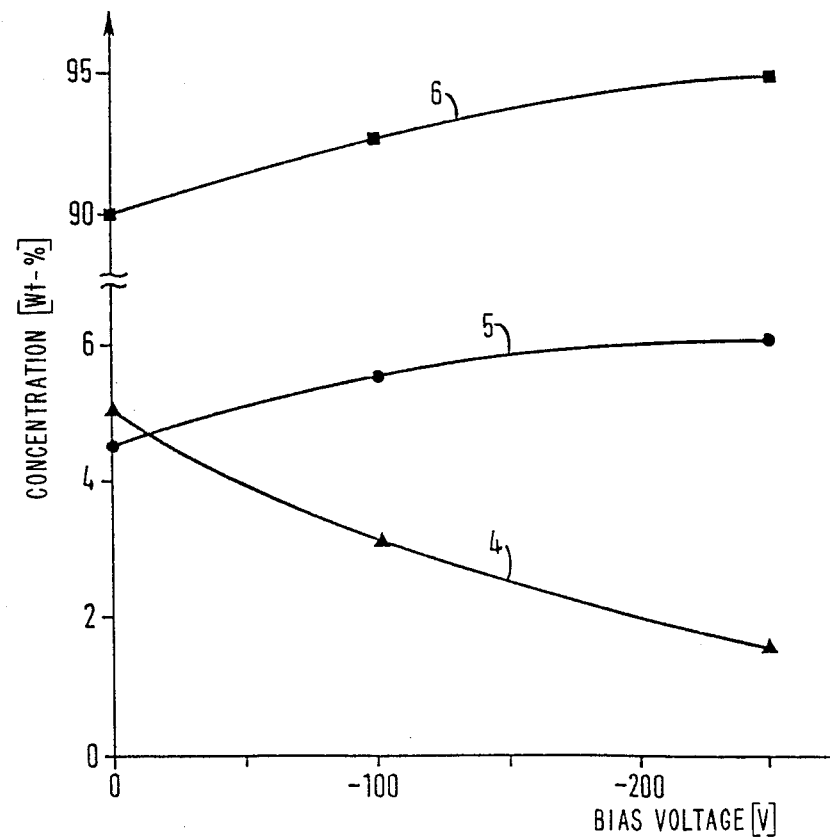
FIG. 2 the aluminum, the vanadium, and the titanium concentration in a titanium aluminum nitride film varies as a function of the substrate voltage.

In a representation corresponding to FIG. 1 the aluminum, titanium, and vanadium concentrations for the three-component system are shown in FIG. 2. Curve 4 of FIG. 2 corresponds essentially to curve 3 from FIG. 1. Curve 5 shows the vanadium and curve 6 the associated titanium proportion varying with the inverse voltage. In FIG. 2, it can be recognized that—in contrast to the decreasing aluminum proportion—the proportions of vanadium and titanium increase which is to be expected. It is, however, surprising, that the relative proportion of vanadium increased noticeably stronger with increasing inverse voltage that the titanium proportion. It is obvious, that specifically the smaller proportion can be increased percentage-wise more strongly than the greater base proportion.

By varying the substrate bias voltage during production selected concentration changes of the individual metals as a function of the film thickness can be achieved.

EXAMPLE 3: Preparation of a TiAlN film on a steel tool

On an iron substrate a titanium aluminum nitride film with low aluminum concentration in the region of the transition zone film/substrate and increasing concentration in the direction toward the film surface is to be applied and the results from FIG. 1 are to be evaluated. The evaporation time by means of the arc was selected so that overall a film thickness of approximately 8 μm results. The mixed nitride film was prepared using two material sources with different aluminum concentrations. During the coating initially a source with a relatively low aluminum concentration with stepwise or incremental changes of the substrate voltage (initially 250 V, subsequently 50 V) was used. Subsequently, using the source with a higher aluminum concentration the remainder of the film was applied also at substrate voltages varied stepwise (initially 250 V, then 50 V).

Figure 3:
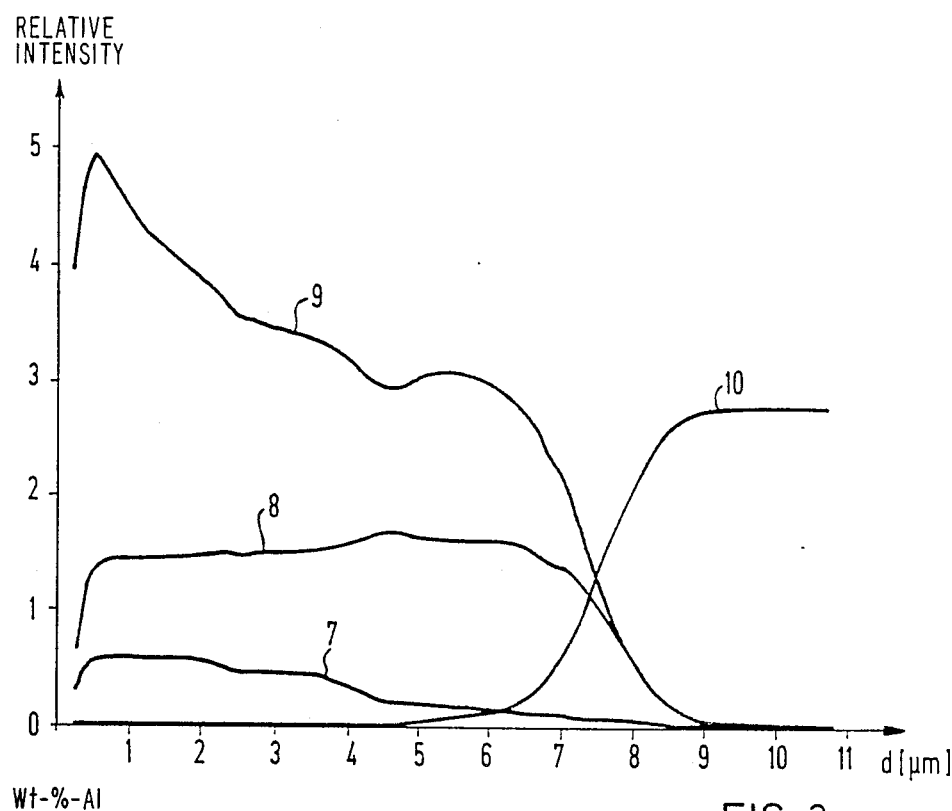
FIG. 3 and FIG. 4 illustrate the concentration depth profile in a tool coated in accordance with the principles of the present invention.
Figure 4:
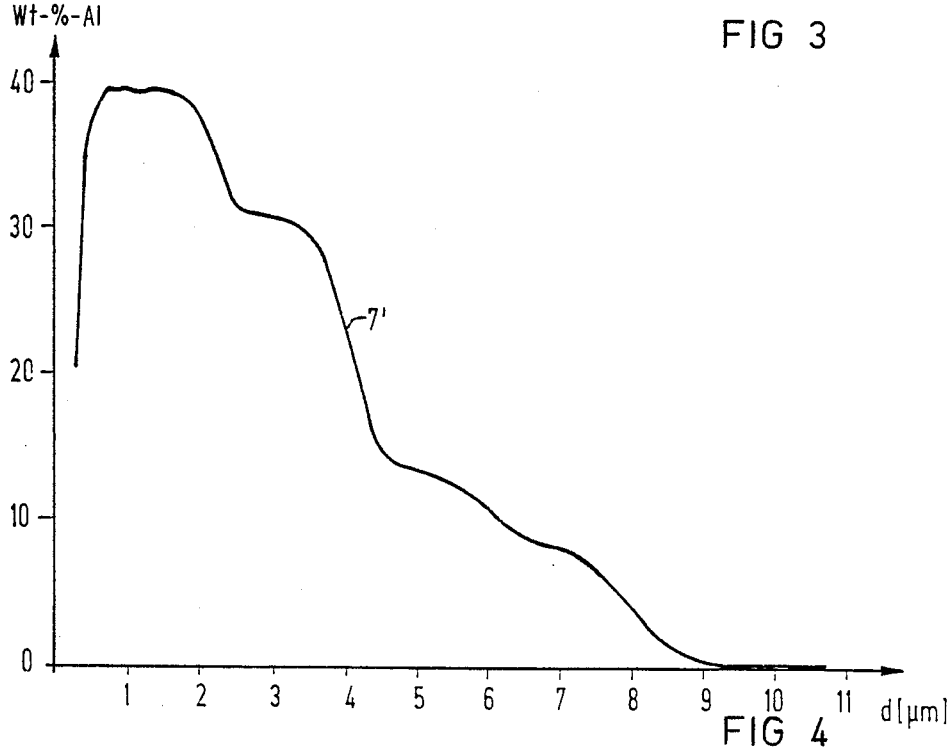

In FIG. 3, an analysis of a depth profile of the discrete elements Al, Ti and N in a TiAlN film of this nature together with Fe of the substrate is shown. The analysis was carried out with GDOS (Glow Discharge Optical Spectroscopy). Curves 7 to 10 show the relative intensities of the elements Al, Ti, N, and Fe and particularly the Al-intensity of FIG. 3 being adjusted to standards of weight-percentage in FIG. 4. In particular, the aluminum plot according to curve 7 in FIG. 3 and to the curve 7' in FIG. 4 shows the voltage dependency determined in example 1. The voltage stages in the depth profile analysis of the film can clearly be seen as concentration changes as a function of the film thickness.

A continuous change of the substrate bias voltage leads correspondingly to gradually changing concentrations. Likewise, by switching between two different substrate voltages mixed nitride films with alternating aluminum concentration can be deposited in a sandwich-like structure.

In practice, the gradient of the metal concentrations can be defined as a function of the given problems and the specific application of the tool to produce a respective corresponding product component. For example, it can be useful to produce in a predetermined film thickness in the first third of the film beginning from the substrate surface a very strong increase of one metal component and subsequently in the remaining region to keep this concentration approximately constant in order to ensure sufficient oxidation or erosion resistance. Other gradients are easily possible within the frame of specific limits with the specific methodoligical variables being empirically determinable.

In determining the empirical values the thermodynamic properties of the metals respectively the multicomponent mixture must be taken into account. As mentioned above, the concentration distribution in the film depends substantially on the inization rate or amount of the individual metals. The assumption can be made that, as a rule, in evaporation by means of an arc source the ionic fraction of metals having a high melting point is higher than that of metals having low melting points. Different selected metals with their melting points, the erosion rates, and the associated ionization degrees are summarized in the table.

TABLE

| | Properties of selected metals | | |
|---|---|---|---|
| Metal | Melting point (°C.) | Erosion rate ($\times 10^{-4}$ g/°C.) | Degree of ionization |
| Cd | 321 | 6.55 | 15% |
| | | 6.2 | 12–15% |
| Zn | 420 | 2.15 | 25% |
| | | 3.2 | 15–20% |
| Mg | 650 | 0.36 | 80–100% |
| Al | 661 | 1.2 | 50–60% |
| Ag | 961 | 1.5 | 60% |
| | | 1.4 | 50–60% |
| Cu | 1081 | 1.15 | 55% |
| | | 1.3 | 60–70% |
| Ni | 1453 | 1 | 60–70% |

TABLE-continued

| Metal | Properties of selected metals | | |
|---|---|---|---|
| | Melting point (°C.) | Erosion rate ($\times 10^{-4}$ g/°C.) | Degree of ionization |
| Fe | 1536 | 0.73 | 65% |
| Ti | 1668 | 0.52 | 80% |
| Cr | 1875 | 0.4 | 100% |
| Mo | 2610 | 0.47 | 100% |
| W | 3410 | 0.62 | 100% |

In selecting other metal combinations the described films should therefore also be possible to prepare. In further examples as mixed nitrides CrAlN films, NbAlN films, or also TiBN films with variable concentrations may be deposited.

Hence the possibility is presented of (purposefully) utilizing the advantages of different metals or hard substances when coating tool surfaces. In particular, initially a concentration or composition may be used to increase adhesion properties while the concentration or composition is changes with an increase in film thickness to provide a surface composition favoring a coating surface with superior machining characteristics. Therefore, the film provided for protection with a changing composition eliminates the usual tradeoff or comprise between adhesion and tooling characteristics in a practical, controlled process.

There has thus been shown and described novel techniques for depositing and controlling the composition of protective films which fulfill all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

We claim:

1. A method for producing a reactively deposited compound film on a substrate to provide a coating for a surface subject to wear, the method comprises the steps of:

using at least one cathode comprising an alloy including at least two metallic elements wherein at least one of the metallic elements has a markedly different melting point from the melting point of the other metallic element;

producing a highly ionized metal vapor from the alloy of the at least one cathode by using at least one electric arc wherein the metal vapor includes ions of a first metallic element and ions of a second metallic element and the amount of ionization for the first metallic element is different from the second metallic element, controlling the ratio between at least the first and the second metallic elements in the deposited compound film by applying a variable voltage potential to the substrate for attracting the ions of the first metallic element to a different extent than the ions of the second metallic element; and varying the voltage potential applied to the substrate over time and as a function of thickness of the deposited film on the substrate.

2. A method in accordance with claim 1, wherein the voltage applied to the substrate is varied between zero and −400 volts.

3. A method in accordance with claim 1, wherein the voltage is varied continuously.

4. A method in accordance with claim 1, wherein the voltage applied to the substrate is varied in incremental steps.

5. A method according to claim 4, further comprising vaporizing a second cathode having a different alloy wherein the difference between the two alloys is in aluminum content.

6. A method in accordance with claim 1, wherein the cathode comprises a TiAl alloy of predetermined Al concentration and the concentration of the aluminum in the initial alloy of the coating being higher than that present at an extreme portion of the coating.

7. A method according to claim 6, wherein the ratio of the aluminum concentration of the film is determined by the voltage value applied to the substrate.

8. A method according to claim 6, further comprises vaporizing a second cathode and the one cathode and the second cathode comprise two material sources having different aluminum content.

9. A method according to claim 1 characterized in that by changing the voltage on the substrate in increments mixed nitride films with sandwich-like structure are grown.

10. A method according to claim 1, characterized in that changing of the concentration of the metals in the deposited film is varied to promote adhesion to the substrate and then to provide an increase in wear resistance for an outer extreme of the deposited film.

11. A method according to claim 1, wherein one of the at least two metallic elements in vanadium.

* * * * *